United States Patent
Appelbaum et al.

(10) Patent No.: US 7,244,997 B2
(45) Date of Patent: Jul. 17, 2007

(54) MAGNETO-LUMINESCENT TRANSDUCER

(75) Inventors: Ian Robert Appelbaum, Providence, RI (US); Douwe Johannes Monsma, Cambridge, MA (US); Kasey Joe Russell, Somerville, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 440 days.

(21) Appl. No.: 10/615,552

(22) Filed: Jul. 8, 2003

(65) Prior Publication Data
US 2005/0007323 A1    Jan. 13, 2005

(51) Int. Cl.
*H01L 29/82* (2006.01)
*H01L 33/00* (2006.01)

(52) U.S. Cl. .................. 257/425; 257/94; 257/79; 257/E29.323; 257/E33.046; 257/E33.063; 257/E33.051; 977/935

(58) Field of Classification Search ............. 257/425, 257/26, 29, 94
See application file for complete search history.

(56) References Cited

U.S. PATENT DOCUMENTS

| | | | |
|---|---|---|---|
| 4,473,834 A | 9/1984 | Soclof | |
| 4,710,936 A | 12/1987 | Shibata | |
| 4,800,415 A | 1/1989 | Simmons | |
| 5,079,774 A | 1/1992 | Mendez | |
| 5,334,854 A | 8/1994 | Ono | |
| 5,416,353 A * | 5/1995 | Kamiguchi et al. ......... 257/421 |
| 5,432,373 A | 7/1995 | Johnson | |

(Continued)

FOREIGN PATENT DOCUMENTS

DE    3225630 A1    1/1984

(Continued)

OTHER PUBLICATIONS

Monsman, DJ, et al, Perpendicular Hot Electron Spin-Valve Effect in a New Magnetic Field Sensor: The Spin Valve Transistor, Physical Review Letters, vol. 74, No. 26 Jun. 26, 1995.

(Continued)

*Primary Examiner*—Jerome Jackson
(74) *Attorney, Agent, or Firm*—James Marc Leas

(57) ABSTRACT

An electronic system includes a three terminal device having a light emitting portion and a magnetically sensitive portion. The magnetically sensitive portion is for modulating light emission from the light emitting portion. The device is a spin valve transistor having a light-emitting quantum well in its collector. The device can convert a magnetic digital signal to both an electrical digital signal and an optical digital signal, wherein either or both of these signals can be provided as a device output. The magnetically sensitive portion of the device is formed of a pair of magnetically permeable layers. When the layers are aligned electron current can pass through with sufficient energy to reach a quantum well where they recombine, generating light. The device may be used to read a magnetic storage medium, such as a disk drive. Or it can be used to provide a display or a memory array composed of single device magnetic write, optical read memory cells. Amplification can be provided to the transistor by adjusting the collector base voltage to provide secondary electrons by impact ionization to provide greater electron current and a correspondingly larger optical emission signal.

56 Claims, 15 Drawing Sheets

U.S. PATENT DOCUMENTS

| | | | |
|---|---|---|---|
| 5,973,334 | A | 10/1999 | Mizushima |
| 6,031,273 | A | 2/2000 | Torok |
| 6,154,475 | A | 11/2000 | Soref |
| 6,340,826 | B1 | 1/2002 | Iliadis |
| 6,359,829 | B1* | 3/2002 | Van Den Berg ............ 365/232 |
| 6,493,196 | B1 | 12/2002 | Noma |
| 6,501,143 | B2* | 12/2002 | Sato et al. .................. 257/421 |
| 6,621,100 | B2* | 9/2003 | Epstein et al. ................ 257/40 |
| 2002/0085332 | A1 | 7/2002 | Ide |
| 2005/0018725 | A1* | 1/2005 | Nurmikko .................... 372/37 |

FOREIGN PATENT DOCUMENTS

| | | |
|---|---|---|
| JP | 61-231788 | 10/1986 |
| JP | 61270885 A | 12/1986 |
| JP | 01-185968 | 7/1989 |
| JP | 06-163983 | 6/1994 |

OTHER PUBLICATIONS

Marco Mastrapasqua, et al, Light emitting charge injection transistor with p-type collector, Appl. Phys. Lett. 60 (19), May 11, 1992.

Marco Mastrapasqua, et al, Light emitting Transistor Based on Real-Space Transfer: Electrical and Optical Properties, IEEE Trans on Elect. Dev. vol. 40, No. 2, Feb. 1993.

G.L. Belenky et al, Collector-up light-emitting charge injection transistors in n-InGaAs /InAlAs/p-InGaAs and n-InGaAs/InP/p-InGaAs heterostructures,J.Appl.Phys.73(12) Jun. 15, 1993.

J. Genoe, pnp resonsant tunneling light emitting transistor, Appl. Phys. Lett. 61 (9) Aug. 31, 1992.

Ludmila Bakueva et al, Multi-layer contacts for organic light-emitting diodes w/ enhanced injection effic., Organic optoelectronic Materials, MRS, SC Moss, Ed, v. 708, 2002.

Yiping HE et al, Hybrid magnetic tunnel junction/vertical cavity surface emitting laser field sensor device, Electronics Letters, Nov. 22, 2001 vol. 37, No. 24.

X. Jiang, et al, Optical Detection of Hot-Electron Spin Injection into GaAs from a Magnetic Tunnel Transistor Source, Phys Rev Let., V 90, No. 25, Jun. 27, 2003.

Ian Appelbaum et al, Ballistic electron emission luminescece, Applied Physics Letters, vol. 82, No. 25, Jun. 23, 2003.

Ian Appelbaum et al, Experiemtnal test of the planar tunneling model for ballistic electron emission spectroscopy, Physical Review B 67 155307 Apr. 10, 2003.

K.J. Russell et al, Room Temperature electro-optic up-conversion via internal photoemission, Applied Physics Letters, vol. 82, No. 18, May 5, 2003.

* cited by examiner

MAGNETO-LUMINESCENT TRANSDUCER

This invention was made with Government support under contract number ECS-9906047 awarded by the National Science Foundation. The Government has certain rights in the invention.

FIELD OF THE INVENTION

This invention generally relates to light emitting devices. More particularly, it relates to a device for emitting light that is controlled by a magnetic field. Even more particularly, it relates to a light emitting transistor in which the light output is modulated by an external magnetic field.

BACKGROUND OF THE INVENTION

Giant magnetoresistance, also called the spin-valve effect, has provided substantial improvement in read heads used for reading data from a magnetic disk drives. The read heads convert each magnetic bit of data into a digital electrical signal that is fed to a processor for display, analysis, or transmission. Processing in additional electronic devices is required before the electrical signal can be delivered to a laser or a light emitting diode for conversion to a digital optical signal. None of the available devices provide a one step process for reading magnetic data and converting the magnetic digital signal directly into an optical signal. Thus, a better system for converting a magnetic signal to an optical signal is needed, and this solution is provided by the following invention.

SUMMARY OF THE INVENTION

It is therefore an object of the present invention to provide a device that converts a magnetic signal into an optical signal;

It is a further object of the present invention to provide a single device with a light emitting portion and a magnetically sensitive portion, in which the magnetically sensitive portion is for modulating light emission from the light emitting portion;

It is a further object of the present invention to provide a spin-valve transistor that has a light emitting portion, in which the spin-valve transistor is sensitive to a magnetic signal and the light emitting portion emits light under the control of the magnetic signal;

It is a further object of the present invention to provide an array of magnetic devices for providing a display or for providing a memory device;

It is a feature of the present invention that a spin-valve effect transistor has a magnetically permeable base layer and a light emitting region in the collector, in which the magnetically permeable base layer is for reading a digital magnetic signal and the light emitting region emits light under the control of the magnetically permeable base layer;

It is a feature of another embodiment of the present invention that a magnetic signal can be provided to each element of an array and then all the elements of the array can be read all at once;

It is a feature of another embodiment of the present invention that a magnetic signal can be provided to each element of an array and then any element of the array can be accessed by addressing;

It is a feature of another embodiment of the present invention that a magnetic signal can be provided to each element of an array to provide a display; and It is an advantage of the present invention that large amounts of data stored on a magnetic storage device can be read and provided as an optical signal to an optical fiber without substantially burdening a system processor.

These and other objects, features, and advantages of the invention are accomplished by an electronic system that includes a single device having a light emitting portion and a magnetically sensitive portion. The magnetically sensitive portion is for modulating light emission from the light emitting portion.

Another aspect of the invention is an electronic system that includes a hot electron metal base transistor. The transistor has a quantum well for facilitating light emission.

Another aspect of the invention is accomplished by an electronic system that includes a magnetic storage medium and a read head. The read head includes a single device transducer for receiving a magnetic signal from the magnetic storage medium and converting the magnetic signal into an optical signal.

Another aspect of the invention is an electronic system that includes an array of memory devices. The memory devices are for receiving magnetic information. The memory devices are also for converting the magnetic information into an optical signal.

BRIEF DESCRIPTION OF THE DRAWINGS

The foregoing and other objects, features, and advantages of the invention will be apparent from the following detailed description of the invention, as illustrated in the accompanying drawings, in which:

FIGS. 3a-3g provide steps for fabricating the spin valve transistor illustrated in FIG. 2a;

FIG. 5b illustrates current flows for writing a "1" to the magnetic write/optical read memory array of FIG. 5a;

FIG. 5c illustrates current flows for writing a "0" to the magnetic write/optical read memory array of FIG. 5a; and FIG. 5d illustrates emitter-base and collector base potentials applied for reading the magnetic write/optical read memory array of FIG. 5a.

DETAILED DESCRIPTION OF THE INVENTION

The present inventors recognized that a magnetic field sensor, such as a hot electron spin valve transistor, could be modified to provide light emission modulated by the magnetic field.

Figure 1:
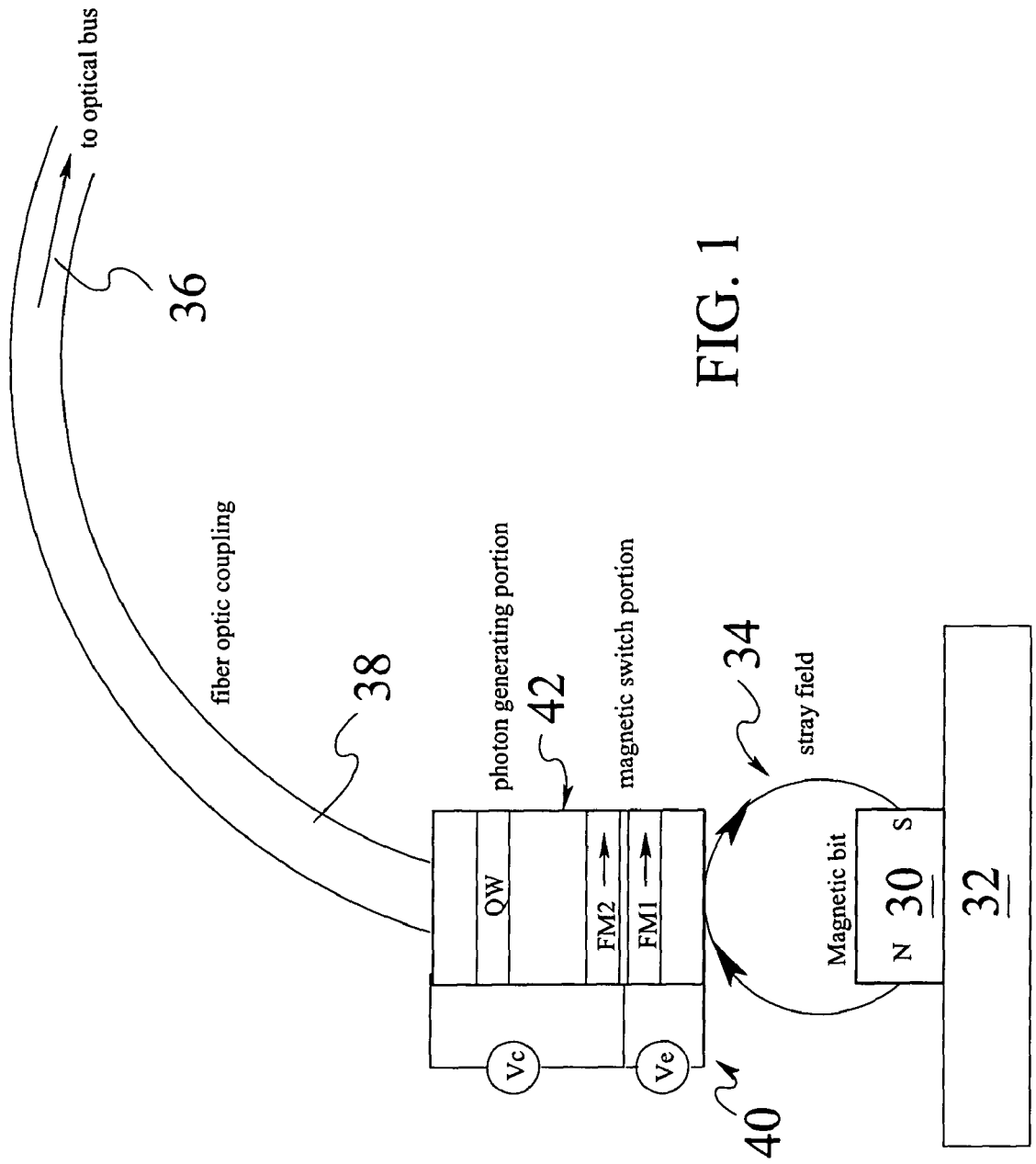
FIG. 1 is a cross sectional diagram of a magnet to optical read head of the present invention, in which a spin valve transistor having a quantum well in the collector emits light depending on the magnetic state of a source of magnetic data, such as a disk drive.

The device of the present invention could be used to read digital magnetic data 30 from a magnetic storage medium, such as magnetic disk 32, and convert magnetic signal 34 directly into optical signal 36 for transmission along optical fiber 38, as shown in FIG. 1. Substantial simplification and savings are thereby obtained since magnetic signal 34, encoded in the stray field of magnetic data 30, is converted to an electrical signal and optical signal 36 within read head 40 that includes single device magnetic to optical transducer (MOT) 42. The processing of data stored on magnetic disk 32 is simplified. Routing electrical data from an ordinary magnetic read head through a processor and then to a light emitting diode or laser is eliminated. Large volumes of data can now be transmitted from magnetic disk 32 to MOT 42 of the present invention where magnetic signal 34 is converted to optical signal 36 for direct insertion into a wave guide, such as optical fiber 38, saving substantial system resources for other uses. MOT 42 has a magnetic switch portion sensitive to the field provided by magnetic data 30. MOT 42 also has a photon generating portion.

Figure 2A:
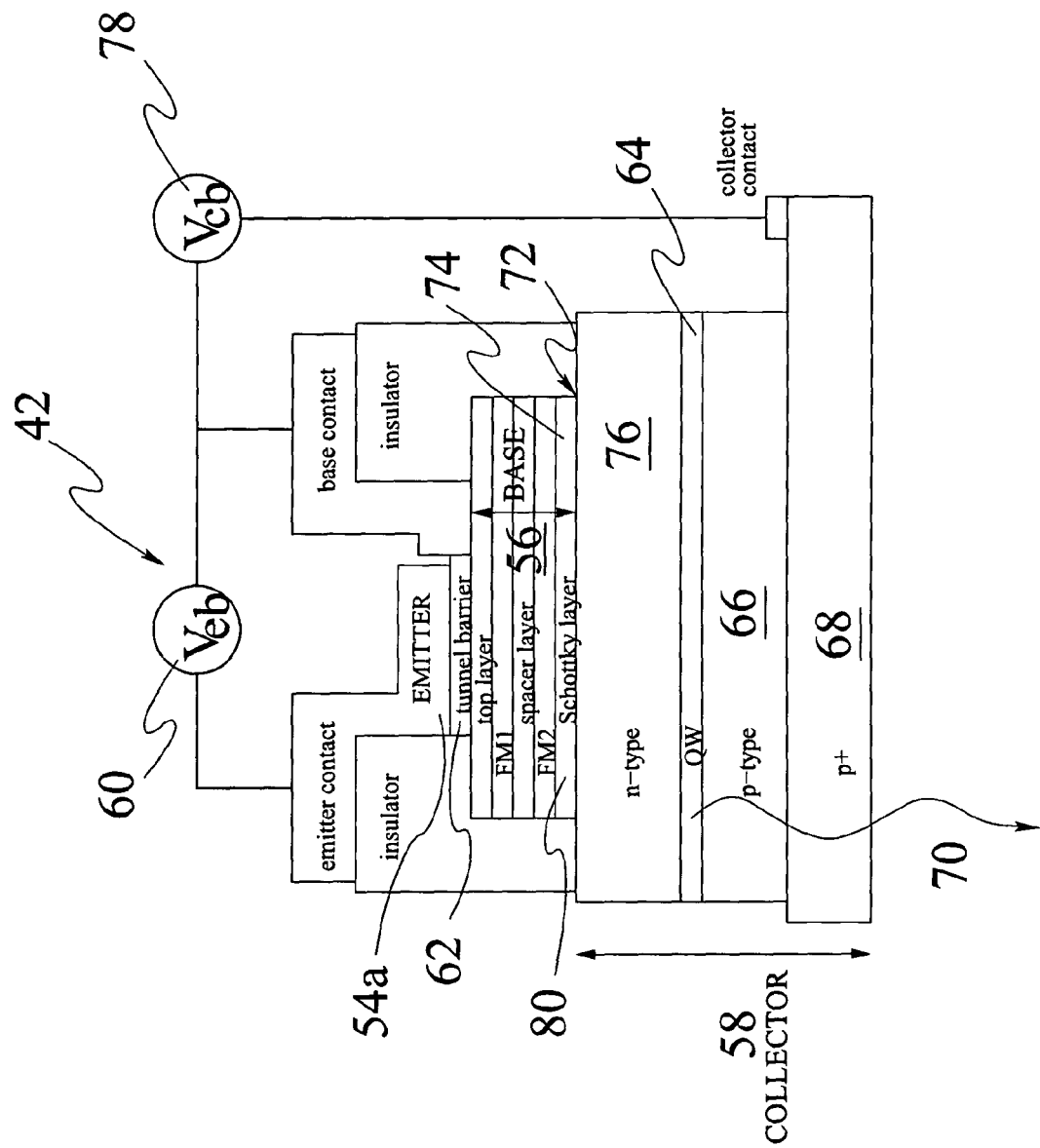
FIG. 2a is a cross sectional view of a spin valve transistor of the present invention having a tunnel emitter, a pair of ferromagnetic layers in the base, and a light emitting region in the collector.

In one embodiment of the invention, MOT 42 includes emitter 54a, base 56, and collector 58, as shown schematically in FIG. 2a. Power supply 60 provides sufficient emitter-base potential so that emitter 54a provides a source of electrons for tunnelling through tunnelling barrier 62. Light is emitted if these electrons have sufficient energy to make their way to quantum well 64 where they can recombine with holes from neighboring p type layer 66 and p+ substrate 68. Photons 70 emitted during this recombination process may be coupled to a wave guide, such as optical fiber 38, as shown in FIG. 1. The planar wave guide may also be fabricated on the same chip as MOT 42 and integrated with MOT 42 so that light emitted from collector 58 is coupled directly into the wave guide.

Control over the flow of electrons from emitter 54a that reach base 56 is provided by the relative states of ferromagnetic layers FM1 and FM2 in base 56. Control is also provided by the potentials selected for emitter-base power supply 60 and collector-base power supply 78. These supplies are adjusted to provide sufficient energy for electrons to pass Schottky barrier diode 72 so they can reach quantum well 64 in collector 58. In one embodiment, the state of FM1 is flipped under the control of adjacent magnetic data 30 (FIG. 1). FM2 can have a substantially higher coercivity than FM1 so FM1 can have its magnetization flipped in the magnetic field of adjacent magnetic data 30 while the state of FM2 is not affected by this field.

If magnetic data 30 aligns the state of FM1 with that of higher coercivity FM2, electron current from emitter 54a passes through both layers. If these electrons are given sufficient potential energy by emitter-base power supply 60, they surmount Schottky barrier 72. If collector-base power supply 78 provides sufficient potential energy to lower the potential of quantum well 64 to below the top of the Schottky barrier, these electrons can reach quantum well 64 where they emit photons as a result of radiative recombination with holes from p-type layer 66 (FIG. 2a).

On the other hand, if magnetic data 30 aligns the state of FM1 opposite to that of FM2, electron current from emitter 54a is attenuated in the base layers, and a relatively small electron current flows into collector 58. Therefore, relatively little light is emitted by quantum well 64.

Thus, base 56 has layer FM1 whose ferromagnetic state is modulated by magnetic data 30, and the relative orientation of FM1 and FM2 in base layer 56 controls the optical emission of device 40.

Figure 3A:
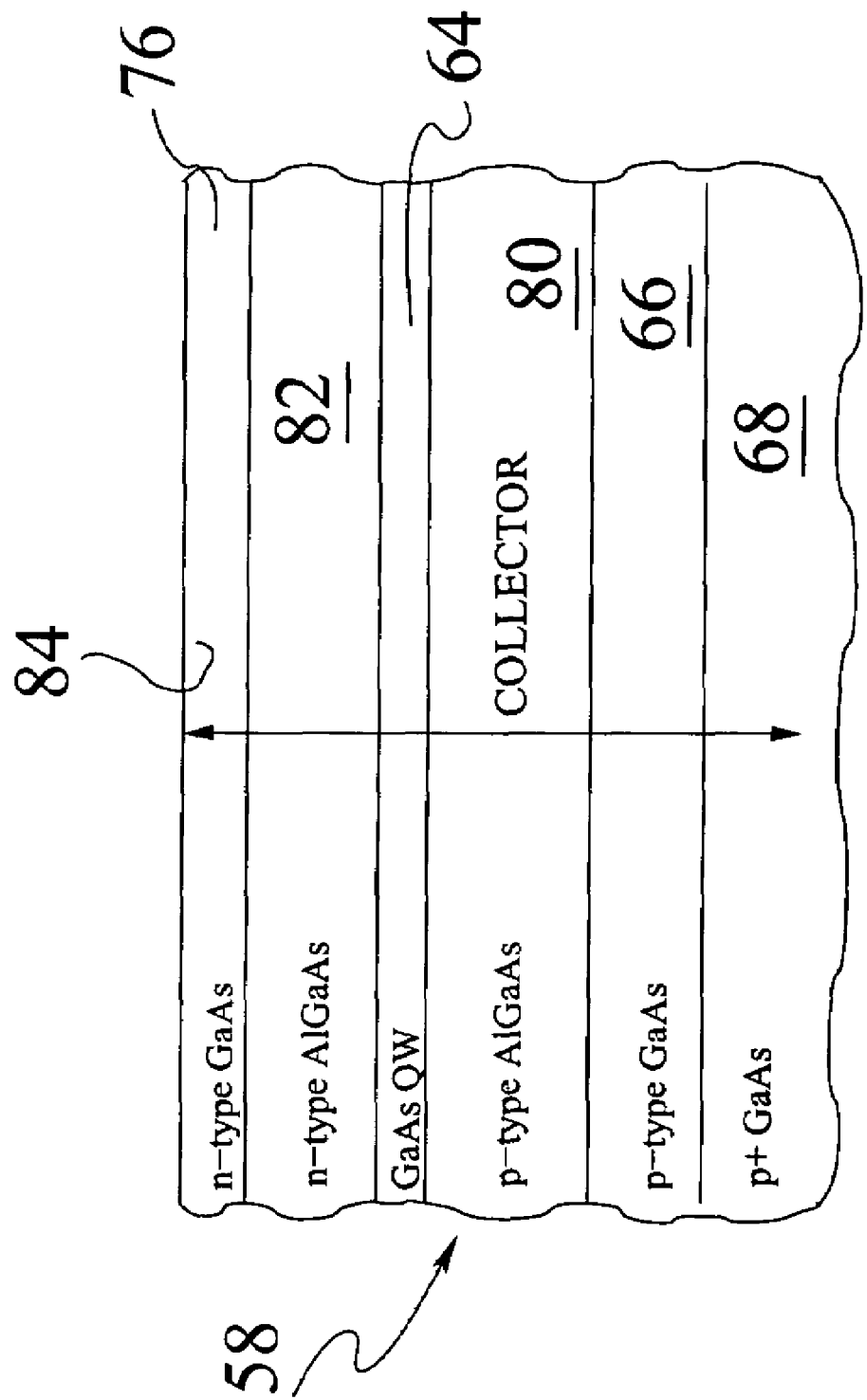

Light-emitting heterostructure collector 58 of MOT 42 was grown on wafer 79 via molecular beam epitaxy with the following structure: starting wafer has a heavily doped p-type GaAs substrate 68 with an resistivity of 5 mOhm-cm, as shown in FIG. 3a. 300 nm p-type GaAs buffer layer 66 doped to $5 \times 10^{18}$ cm$^{-3}$ is grown by molecular beam epitaxy. Next 300 nm p-type $Al_{0.30}Ga_{0.70}As$ layer 80 doped to $5 \times 10^{18}$ cm$^{-3}$ is grown. Then 10 nm GaAs undoped quantum well (QW) layer 64 and 100 nm n-type $Al_{0.30}Ga_{0.70}As$ layer 82 doped to $2 \times 10^{17}$ cm$^{-3}$ are grown for forming quantum well 64. 20 nm n-type GaAs cap layer 76 doped to $2 \times 10^{17}$ cm$^{-3}$ is then grown, on which will be formed Schottky barrier 72 when base metal is later deposited. All n-type doping is with Si, all epitaxial p-type doping is with Be, and substrate doping is with Zn.

The material, thickness, and doping parameters were chosen to provide an n-type Schottky interface at surface 84 of n-type cap layer 76. They were also chosen to provide a hole-rich recombination region in the otherwise undoped GaAs quantum well as a result of adjacent p type buffer layer 66 and p doped substrate 68. The n-type surface doping of layers 76 and 82 allows the injected electrons to have long lifetimes as majority carriers in lightly doped n type layer 76 and n type layer 82 before recombining radiatively in quantum well 64. This doping must be relatively light to ensure Schottky contact, but not so light that the surface depletion region extends into the PIN junction of quantum well 64, which would cause excess leakage current during reverse-biasing with base-collector power supply 78. The p-type doping level beneath undoped portion of quantum well 64 must be significantly higher than that of the n-type region to compensate the electron population provided by adjacent n-type AlGaAs layer 82.

Figure 3B:
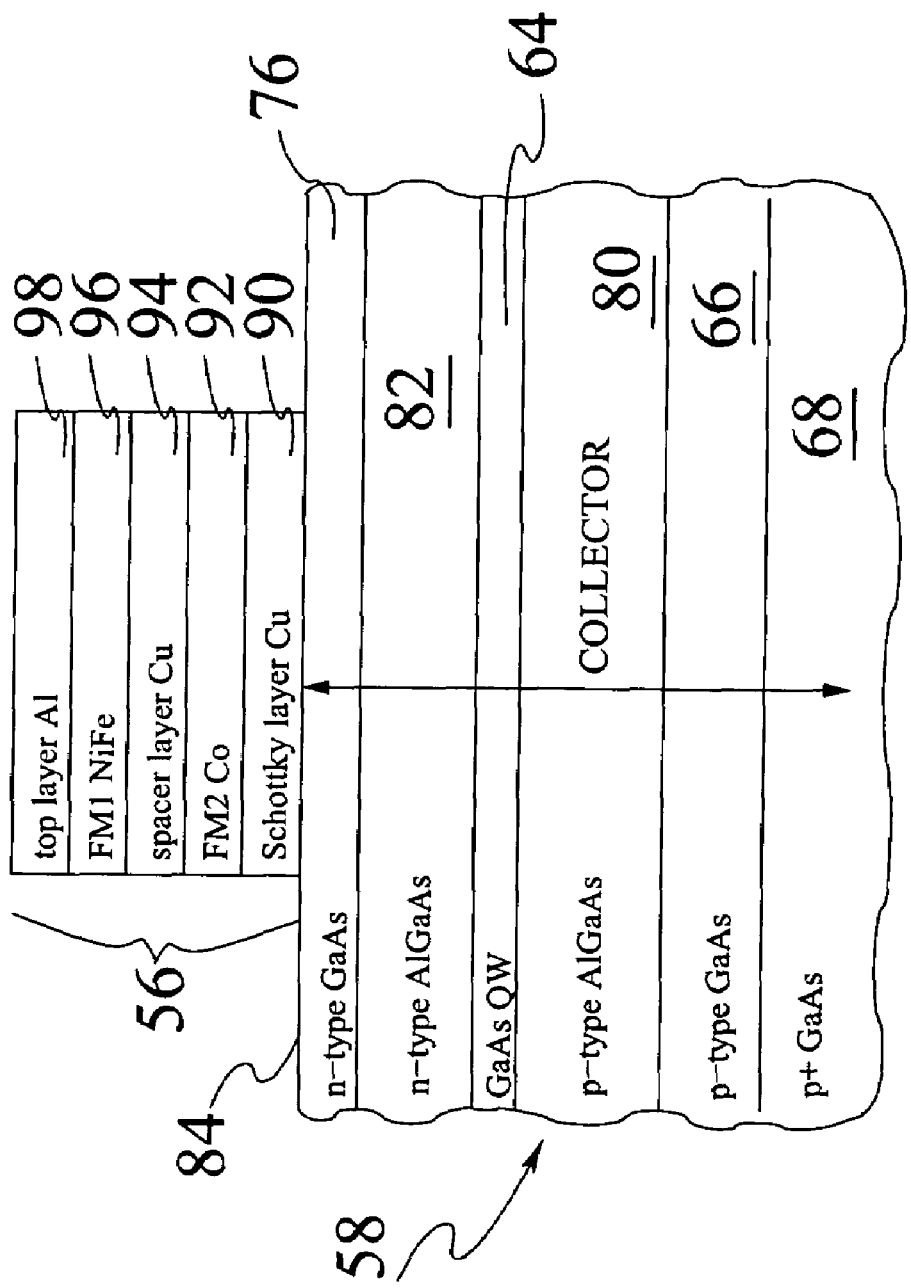

The semiconductor wafer can now be processed using standard shadow-mask and photo-lithographic techniques to fabricate base and emitter portions of tunnel-junction emission MOT 42, as shown in fabrication steps illustrated in FIGS. 3b-3g. After cleaning surface 84 with dilute $NH_4OH$ or HCl, spin-valve base 56 is fabricated by depositing metal layers through a shadow mask. Metal layers include 100 Angstrom Cu layer 90 for Schottky barrier diode 72, 40 Angstrom Co layer 92 for FM2, 50 Angstrom Cu spacer layer 94, 40 Angstroms NiFe layer 96 for FM1, and 100 Angstrom Al top layer 98, all of which can be deposited using thermal evaporation or electron-beam deposition through a shadow mask, as shown in FIG. 3b.

With a coercivity of about 60 gauss cobalt layer 92 provides the high coercivity FM2 layer while nickel-iron layer 96, with a coercivity of about 10 gauss, provides the lower coercivity FM1 layer that is flipped in the adjacent magnetic field.

Because metal layers are all deposited with the same shadow mask, base structure 56, leaves a portion of surface 84 of collector 58 exposed for contact, as shown in FIG. 3b.

Figure 3C:
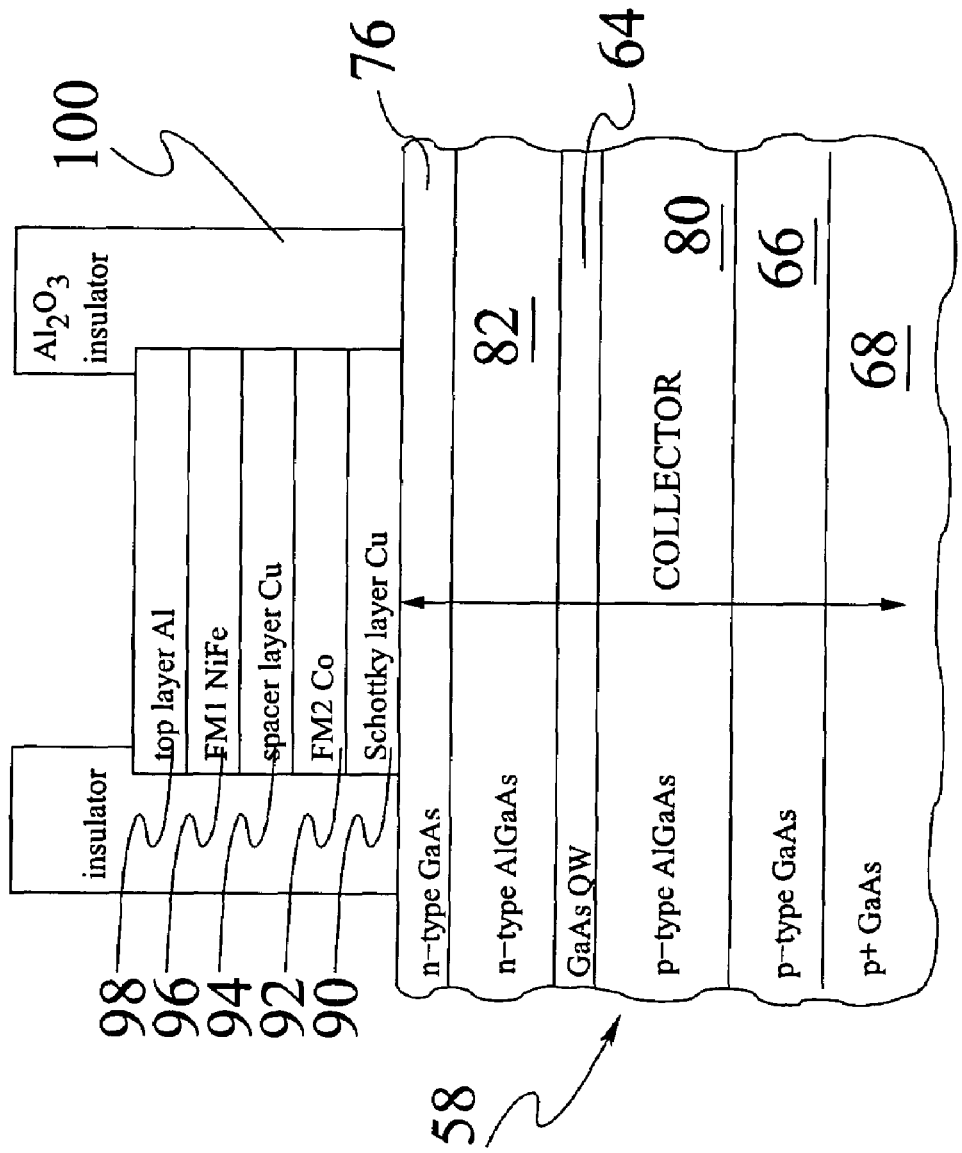
Figure 3D:
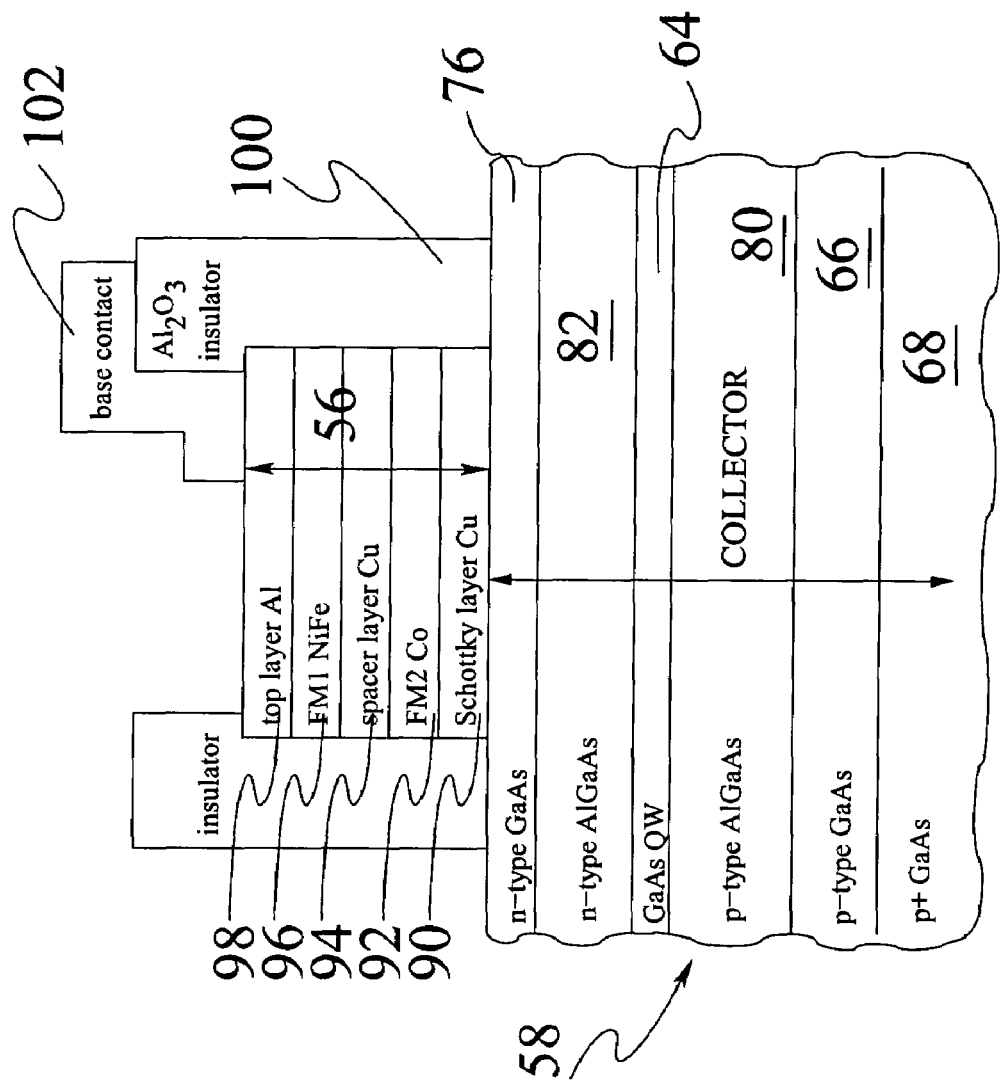

Next, insulator 100, such as 1000 Angstroms $Al_2O_3$, is deposited, partially on base 56 and partially extending on surface 84 of collector 58 to form a contact pad and to define the emitter region as shown in FIG. 3c. Metal contact pad 102 is then deposited for providing ohmic contact to base 56, as shown in FIG. 3d. Metal contact pad 102 is formed by deposition of a metal, such as aluminum or chrome-gold through a shadow mask, partially on insulator bonding pad 100 and partially on top of aluminum layer 98 of base 56.

Figure 3E:
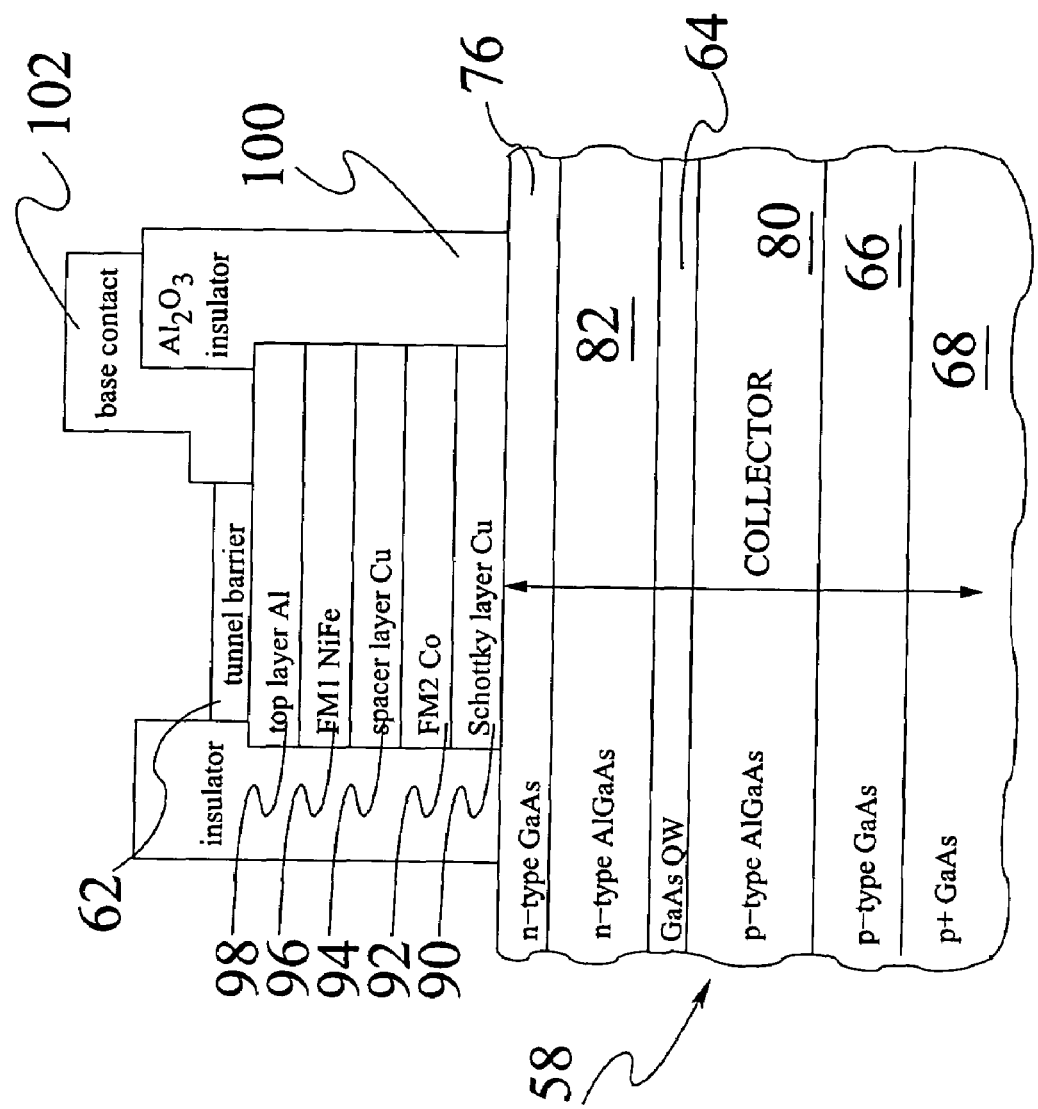
Figure 3F:
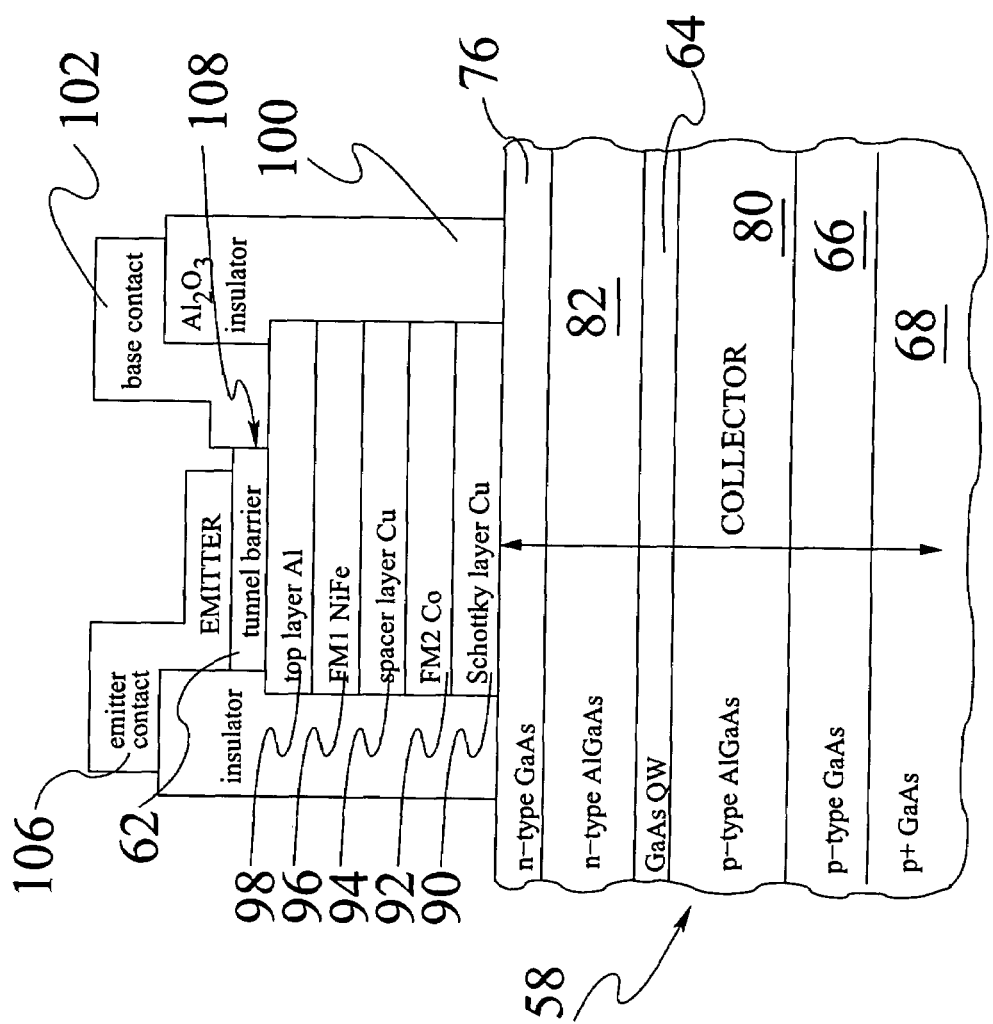

In the next step, top aluminum base layer 98 is oxidized in ozone to form tunnel oxide 62, as shown in FIG. 3e. Ozone to oxidize aluminum base layer 98 may be provided by shining ultraviolet light on the metal in air. The ultraviolet light creates ozone from oxygen in the air, and the ozone reacts with the aluminum to form $Al_2O_3$. Metal emitter 106, such as 1000 Angstroms Al, can be deposited through a shadow mask, partially on insulator bonding pad 100 and partially on tunnel oxide 62 on top base layer 98 to form metal emitter 106 on tunnel insulator 62, as shown in FIG. 3f. Thus, tunnel junction 108 to metal base 56 is formed. The 1 to 2 nm thick oxide does not effect bonding to base metal contact pad 102.

Figure 3G:
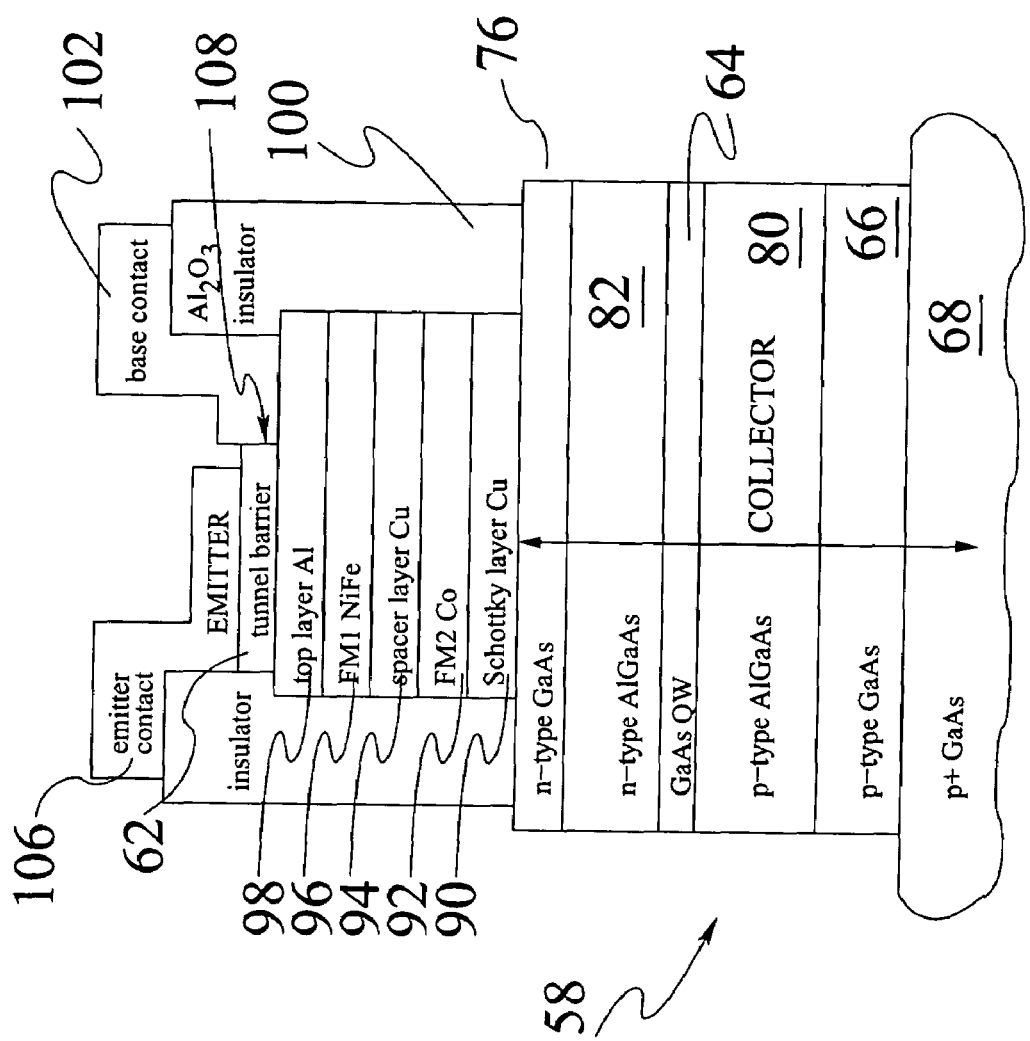

Photoresist is patterned on top of the tunnel junction 108 and metal contacts 102, 106, and a mesa is etched down through n-type, quantum well, and p-type collector semiconductor layers to p+ GaAs substrate 68 with wet etching, such as $NH_4OH:H_2O_2:H_2O$ solution, as shown in FIG. 3g. Electrical contact to metal emitter 106 and base contact 102 can be made with wire bonds to the portion of these contacts located on insulator 100. Contact to collector substrate 68 can be made by cold-pressing an Indium contact to the back substrate surface or to a contact deposited on the front (not shown).

Figure 4A:
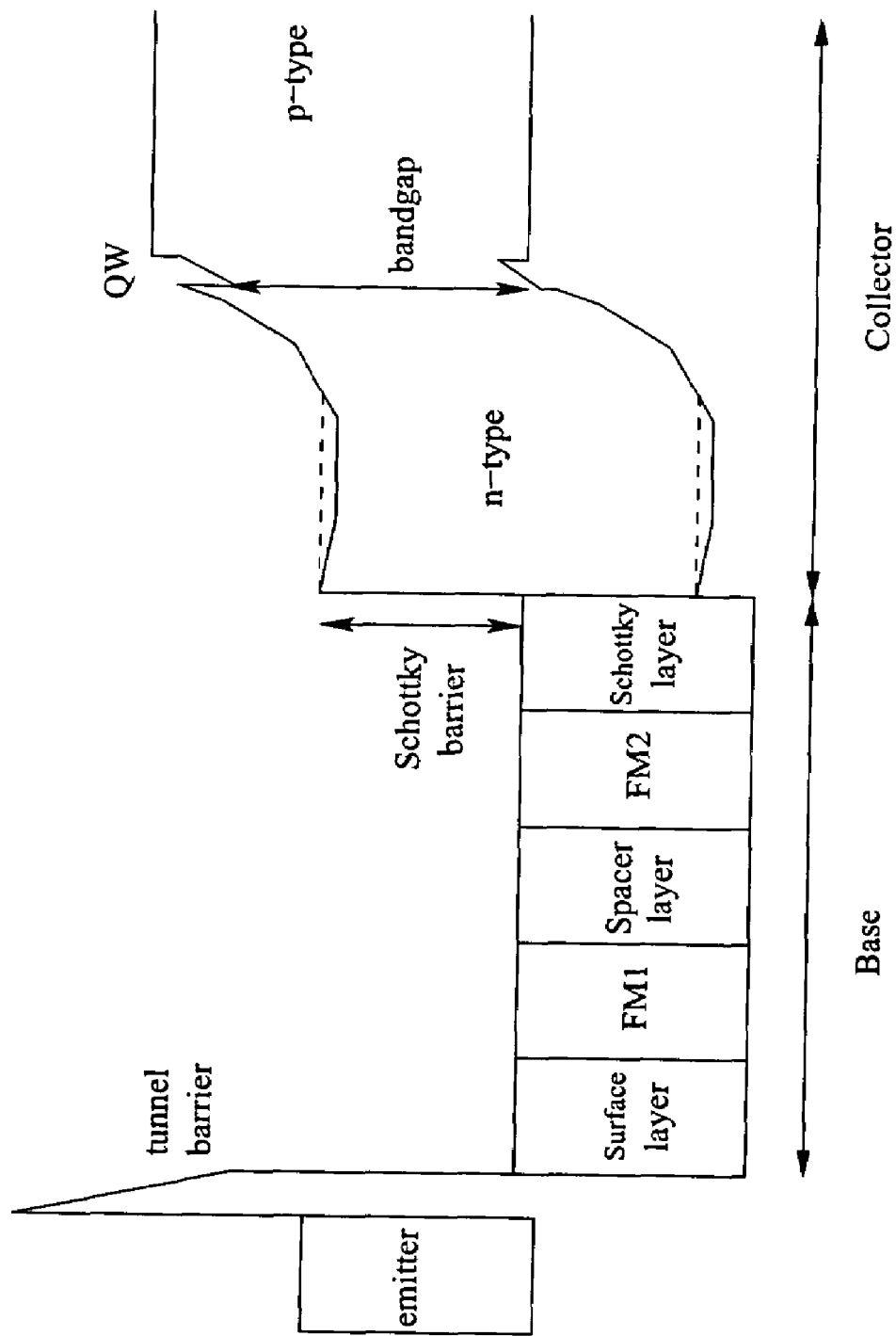
FIG. 4a is a band diagram of the spin valve transistor illustrated in FIG. 2a without collector-base bias.

A schematic conduction band diagram of the tunnel junction embodiment of the light emitting spin valve transistor without bias applied is shown in FIG. 4a for a device having a collector surface doped in the range from about $1 \times 10^{16}$ to about $5 \times 10^{17}$. The doping is preferably sufficiently heavy to provide that the Schottky is shielded from the p type substrate below the quantum well so it does not become forward biased when a positive potential is applied to the collector. The doping should not be so heavy that an ohmic contact is created.

Figure 4B:
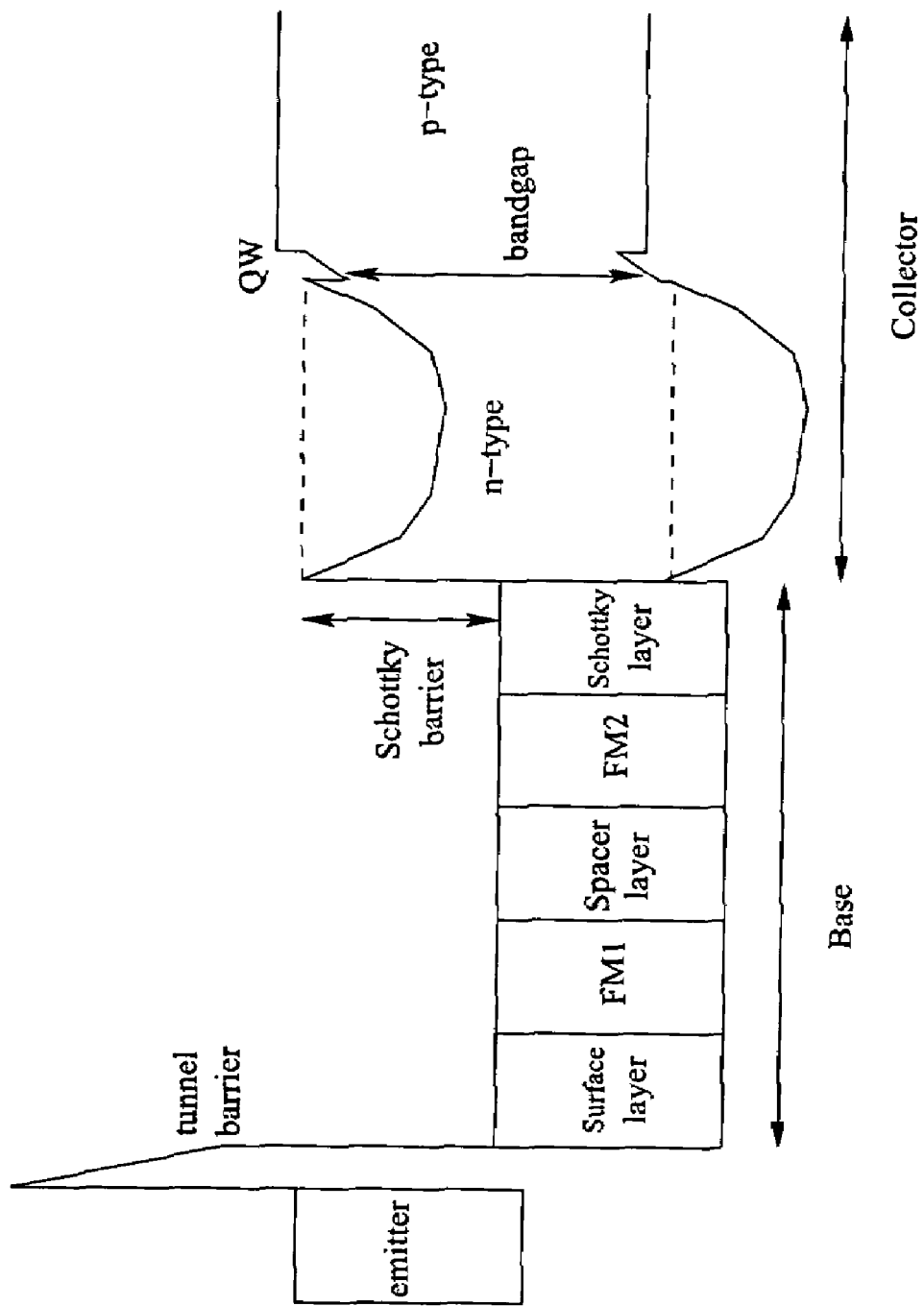
FIG. 4b is a band diagram of the spin valve transistor illustrated in FIG. 2a with the collector-base bias applied.

Electron injection is controlled by applying an emitter-base voltage greater than the Schottky barrier height between the emitter and base tunnel junction contacts, as shown in FIG. 4b. A typical Schottky barrier height on the GaAs collector is about 0.8 to about 0.9 eV. The emitter-base potential provided by power supply 60 has about −2 Volts on the emitter for high injection current. The emitter-base voltage is adjusted to provide a high level of injection current without shorting tunnel junction 108. The collector-base potential provided by power supply 78 is approximately $Eg-E_{SB}$ or approximately +0.85 Volts on the collector for the AlGaAs/GaAs quantum well sample described herein. The collector-base voltage, which reverse biases the Schottky diode, pulls the quantum well down below the top of the Schottky barrier so that electrons at that energy can fall into the quantum well and radiatively recombine with holes there. Thus, the collector is positively biased with respect to the base and the emitter is negatively biased with respect to the base.

As discussed previously, the relative magnetizations of the ferromagnetic layers controls the attenuation of the ballistic electron current through the base and therefore the number of electrons which recombine with holes in the quantum well.

Figure 2B:
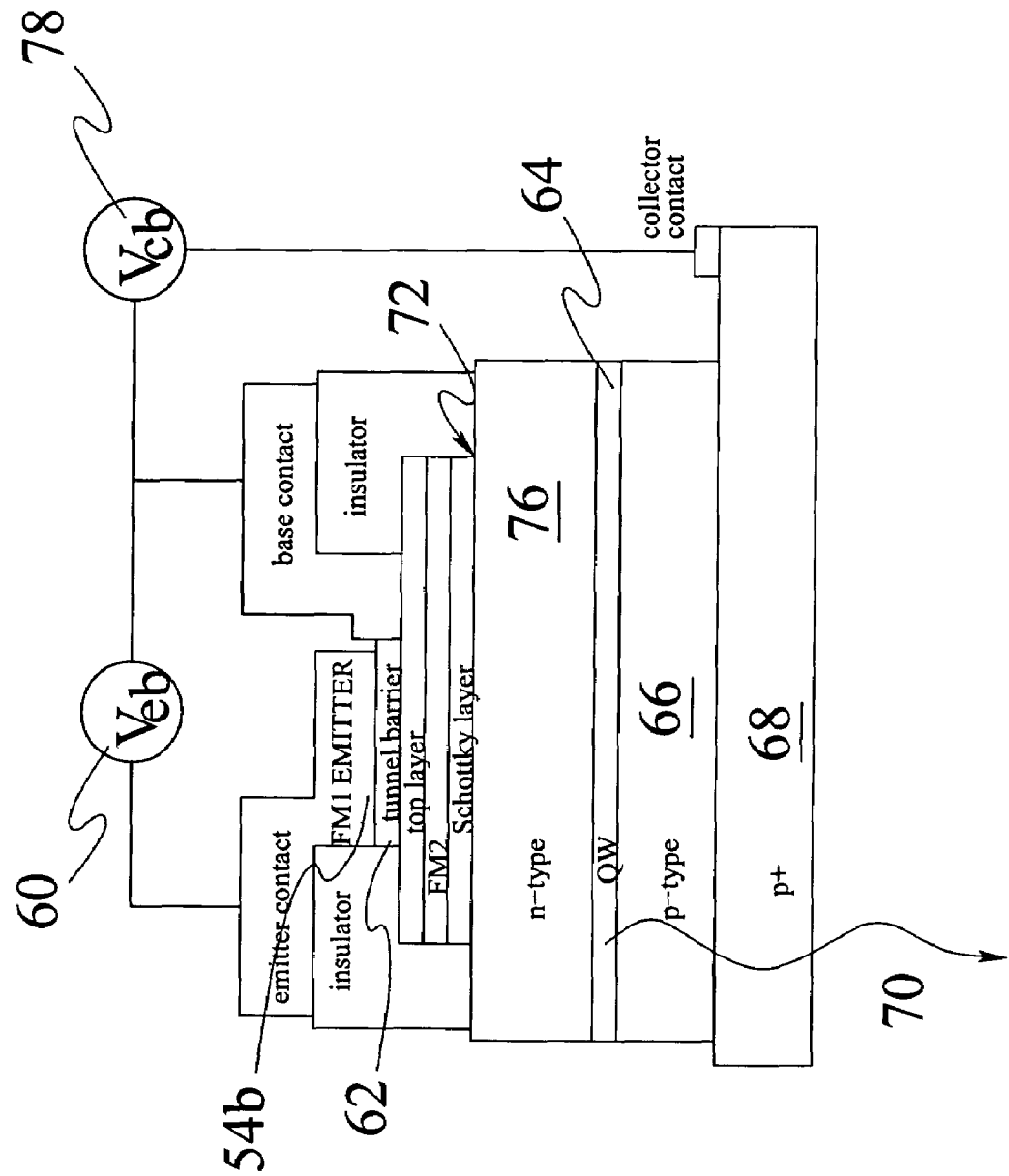
FIG. 2b is a cross sectional view of a spin valve transistor similar to that of FIG. 2a but with one of the ferromagnetic layers in the emitter.

In a variation on the above structure, FM1 can be provided in emitter 54b, above tunnel barrier 62, as shown in FIG. 2b, eliminating two metal layer depositions.

Figure 2C:
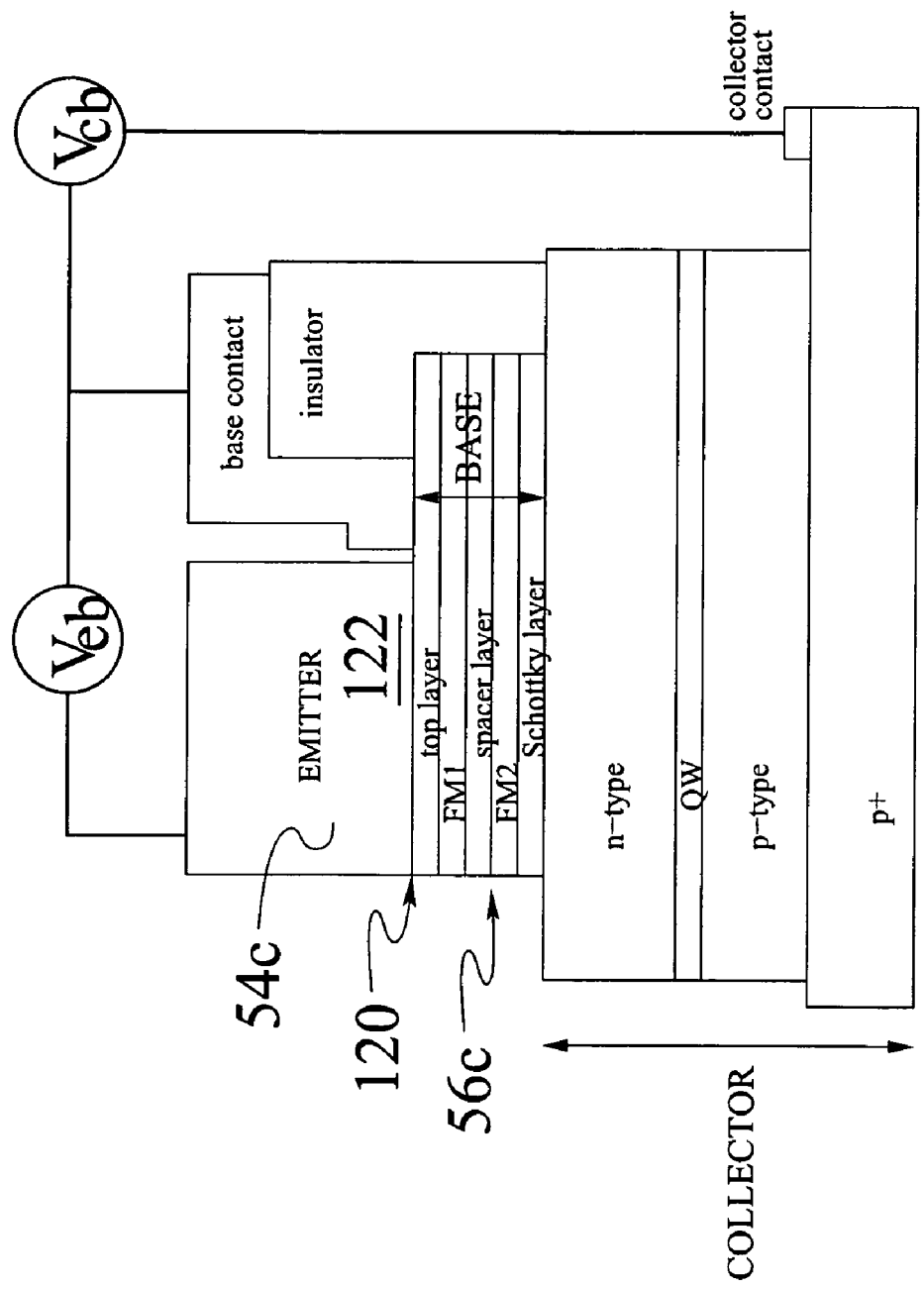
FIG. 2c is a cross sectional view of a spin valve transistor similar to that of FIG. 2a but with a Schottky barrier emitter contact instead of a tunnelling emitter contact.

Tunneling barrier 62 and the tunnel junction between emitter 54a and base 56 can be replaced with another barrier, such as second Schottky barrier 120, as shown in FIG. 2c. To fabricate, lightly doped n type semiconductor wafer 122 is direct bonded in high vacuum to top layer 98 of metal base layer 56 to form Schottky barrier 120 and emitter 54c. Direct bonding in high vacuum is accomplished using a process as described in the paper, "Room Temperature-Operating Spin-Valve Transistors Formed by Vacuum Bonding," D. J. Monsma et al., Science, vol. 281, Jul. 17, 1998, pp. 407-409. A more heavily doped region is then provided for the ohmic emitter contact, as also described in the Monsma paper. Further details on direct bonding are provided in U.S. Pat. No. 4,247,034, incorporated herein by reference.

Electrons passing into the collector are accelerated in the field provided by the applied collector-base voltage. If a sufficiently high collector-base voltage is applied then these electrons will be accelerated to create secondary electrons by impact ionization, increasing the electron current in the conduction band. This higher electron current generates a higher number of photons in the quantum well, providing an amplified optical signal. A collector-base voltage on the order of a few volts to hundreds volts is preferred to provide this avalanche amplification feature. For example, a one order of magnitude amplification in electron current and optical signal is achieved by providing a collector-base voltage on the order of about 5 to 10 volts.

Figure 2D:
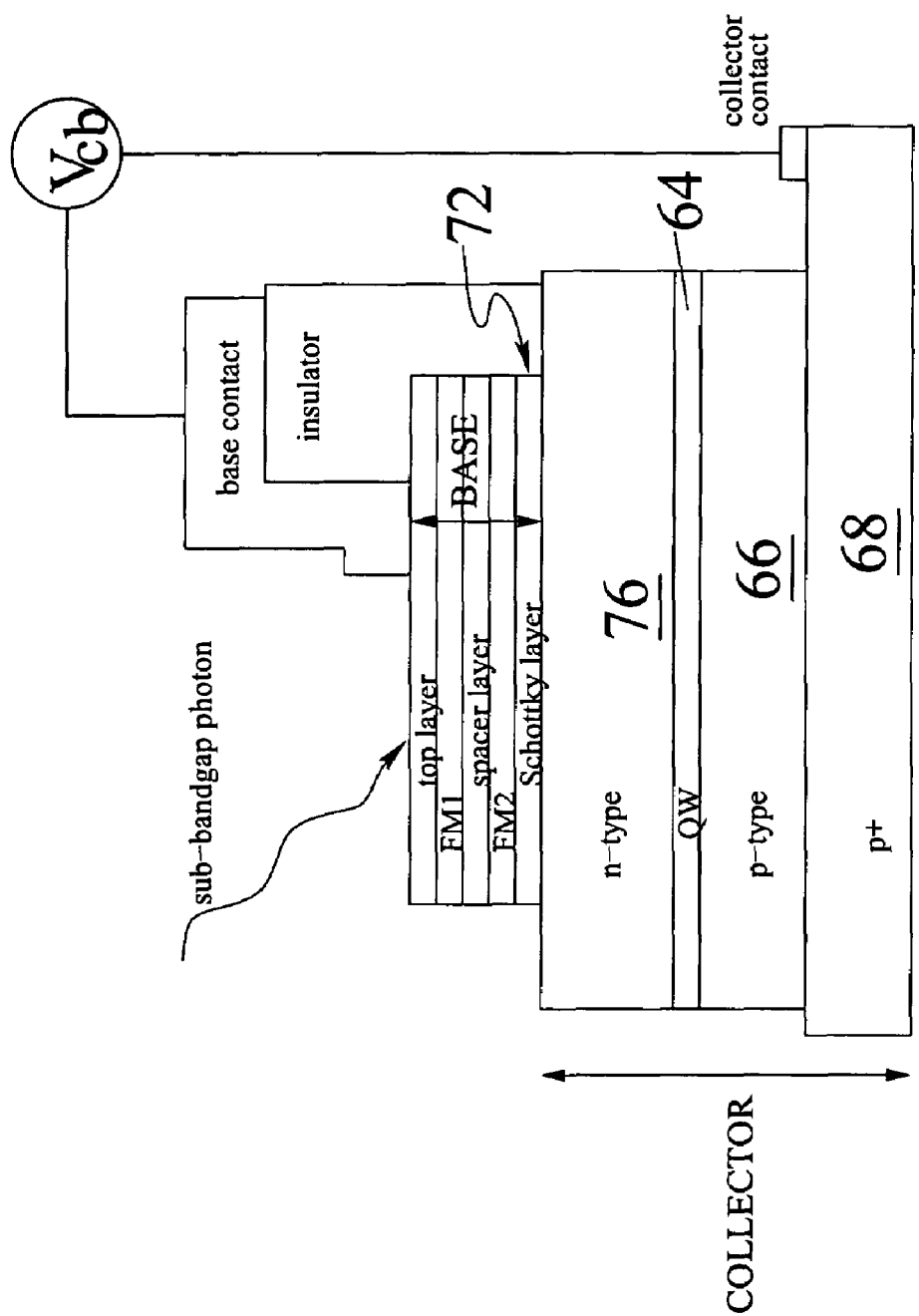
FIG. 2d is a cross sectional view of a spin valve device similar to that of FIG. 2a but with no emitter, and hot electrons provided by a sub-bandgap photon source.

In another embodiment, sub-bandgap photons illuminate multilayer base 56 to photoexcite electrons in top base metal layer over the base-collector Schottky barrier and create a hot electron photocurrent, as shown in FIG. 2d. In this embodiment the emitter can be eliminated altogether. Since illumination is absorbed into metal with a characteristic skin depth, more electrons are photoexcited at the surface. These electrons travel through the ferromagnetic multilayer when the two layers are aligned and are attenuated when they are anti-aligned, as described herein above for electrons injected through a tunnel-barrier or a Schottky-barrier. This design allows for two-terminal operation and avoids the necessarily complicated fabrication steps of making a tunnel junction or vacuum bonding.

Figure 5B:
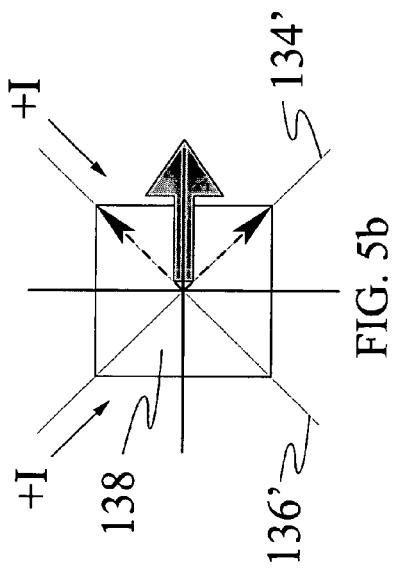
Figure 5C:
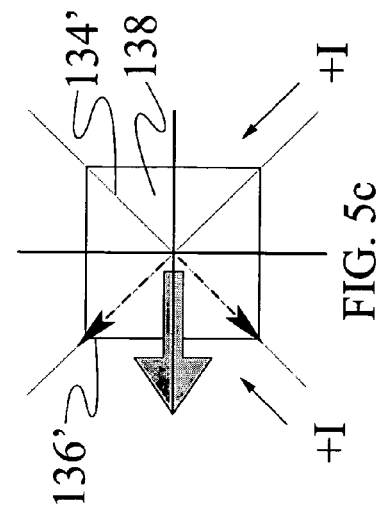
Figure 5A:
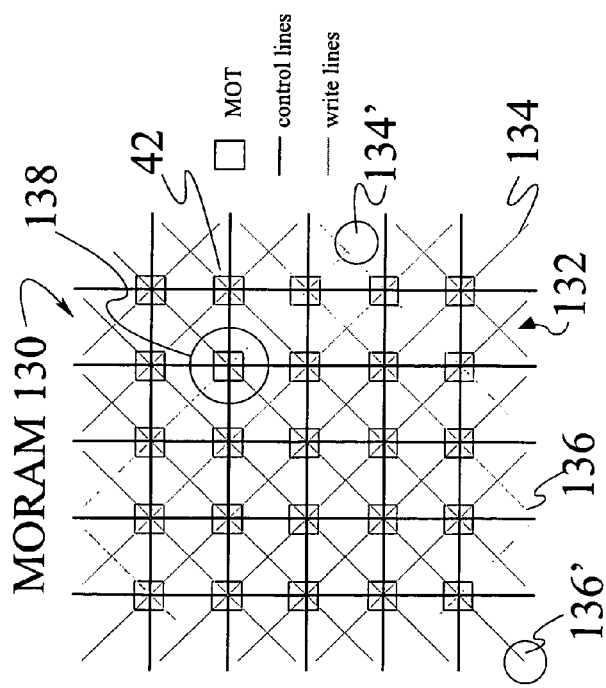
FIG. 5a is a schematic diagram of a magnetic write/optical read memory array of the present invention in which a spin valve transistor similar to that of FIG. 2a is used for each memory element.

The invention can also be used to form a magnet write/optical read display or random access memory (MORAM). MOT 42 is provided at each cell of MORAM 130, as shown in FIG. 5a. In this MORAM 130, one bit of information is stored in each MOT 42, encoded as the relative magnetization of a ferromagnetic layer in each MOT 42.

For writing to each MOT 42 of MORAM 130, write wire array 132 is provided, wherein wires 134, 136 of write wire array 132 intersect at each MOT 42. Current may be provided in selected write wires 134', 136' to generate a magnetic field at each MOT 42 crossed by those write wires. However, the current in each of the selected write wires, 134', 136' is insufficient to provide a magnetic field that exceeds the coercive field of either ferromagnetic layer of MOT 42. This coercive field is exceeded only for that particular MOT 138 where current is provided in both crossing wires 134' and 136'. The magnetic fields generated below wires 134' and 136' by the currents in both wires add up to a magnetic field in excess of the coercive field for MOT 138 where wires 134' and 136' intersect, as shown in FIGS. 5b, 5c. MOT 138 can have its FM1 layer reset by this combined magnetic field, and thus a 1 or a 0 can be written to this particular memory element of MORAM 130, depending on the direction of current flow in wires 134', 136'.

Figure 5D:
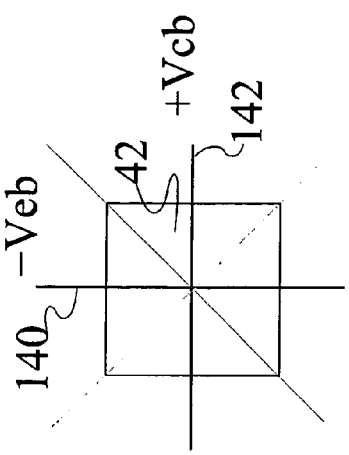

Optical signals, determined by the relative magnetization of the ferromagnetic layers, can be read from all MOT 42 in MORAM 130 by providing emitter-base and collector-base potentials, as shown in FIG. 5d. Only one optical detector is needed to read output from all MOTs 42 in MORAM 130 at once, thus providing a display of the data, for example, for a computer monitor, TV, or other electronic device. Alternatively, control over emitter-base voltage wire 140 and collector-base voltage wire 142 can be provided to individually address each MOT 42 to provide ability to optically read data in one MOT at a time of MORAM 130, such as MOT 138, as shown in FIG. 5*a*. For example, if only emitter-base voltage control wire 140 and one collector-base voltage control wire 142 is provided with the power supply voltages, using standard wordline-bitline-type addressing, then only one cell-MOT 138—in MORAM 130 will have both requisite power supply voltages, and only that cell will be able to emit light depending on the relative orientation of its ferromagnetic layers.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. An electronic system, comprising a single device and an external magnetic field, said single device having a light emitting portion, a hot electron emitting portion, a magnetically sensitive portion, and an energy barrier, wherein said magnetically sensitive portion includes a first magnetically permeable layer and a second magnetically permeable layer, wherein said energy barrier blocks most thermalized electrons from traveling from said magnetically sensitive portion to said light emitting portion, wherein magnetization state of said first magnetically permeable layer is aligned with magnetization state of said second magnetically permeable layer when said external magnetic field extends in a first direction, and wherein magnetization state of said first magnetically permeable layer is anti-aligned with magnetization state of said second magnetically permeable layer when said external magnetic field extends in a second direction opposite said first direction.

2. An electronic system, as recited in claim 1, wherein said single device is for converting a magnetic digital signal directly into an optical digital signal, wherein variation of said external magnetic field provides said magnetic digital signal.

3. An electronic system, as recited in claim 2, wherein said single device is for converting said magnetic digital signal to both an electrical digital signal and into said optical digital signal, wherein either or both of said signals can be provided as a device output.

4. An electronic system, as recited in claim 1, wherein said single device includes a three-terminal light-emitting transistor, said transistor having an emitter, a base, and a collector, wherein said light is emitted from said collector.

5. An electronic system, as recited in claim 2, wherein said magnetically sensitive portion includes a magnetic switch, wherein switch position is determined by said magnetic digital signal, wherein a first intensity of light is emitted in a first switch position and a second intensity of light is emitted in a second switch position, wherein said first intensity is greater than said second intensity.

6. An electronic system, as recited in claim 4, wherein said transistor comprises ballistic spin filtering to spin polarize and analyze electrons.

7. An electronic system, as recited in claim 6, wherein when said first and said second magnetically permeable layers are aligned said spin polarized electrons penetrate and when said first and said second magnetically permeable layers are anti-aligned, said spin polarized electrons are attenuated.

8. An electronic system, as recited in claim 7, wherein said first and said second magnetically permeable layers are both located in said base.

9. An electronic system, as recited in claim 7, wherein said first magnetically permeable layer is located in said base and said second magnetically permeable layer is located in said emitter.

10. An electronic system, as recited in claim 4, wherein said emitter is tunnel coupled to said base across an insulator.

11. An electronic system, as recited in claim 4, wherein said single device includes a buried quantum well within a semiconductor collector, wherein said quantum well is formed of a quantum well material having a lower band gap than adjacent material.

12. An electronic system, as recited in claim 11, wherein said material having a lower band gap has a direct transition for more efficient generation of light in said quantum well.

13. An electronic system, as recited in claim 11, wherein said semiconductor collector further comprises a Schottky contact region and wherein said energy barrier comprises a Schottky barrier.

14. An electronic system, as recited in claim 13, wherein said semiconductor collector further comprises an n type Schottky contact region, an undoped quantum well region, and a p type substrate layer heterostructure.

15. An electronic system, as recited in claim 11, wherein said light emitted by said single device comprises photons having an energy approximately equal to said band gap of said quantum well material.

16. An electronic system, as recited in claim 4, wherein said emitter is capable of providing ballistic electrons across said base to said collector when an emitter-base bias is provided with a potential exceeding said energy barrier.

17. An electronic system, as recited in claim 16, wherein said energy barrier comprises a base-collector Schottky barrier.

18. An electronic system, as recited in claim 4, wherein said single device comprises a spin valve transistor having a source for complementary carriers and a place for recombining to generate said photons, wherein said energy barrier comprises a base-collector energy barrier.

19. An electronic system, as recited in claim 18, wherein said base-collector energy barrier comprises a Schottky barrier, said source for complementary carriers comprises a p-type substrate layer, and said place for recombining comprises a quantum well.

20. An electronic system, as recited in claim 18, wherein said spin valve transistor includes a base having a first magnetically permeable layer and a second magnetically permeable layer.

21. An electronic system, as recited in claim 20, wherein said first magnetically permeable layer is ferromagnetic.

22. An electronic system, as recited in claim 20, wherein said second magnetically permeable layer has a lower coercive field level than said first magnetically permeable layer so said second layer can be switched without switching said first layer to provide for turning on and turning off current in said single device with an intermediate level magnetic field.

23. An electronic system, as recited in claim 22, wherein said spin valve transistor includes a base-collector contact comprising a Schottky barrier diode having a Schottky barrier height, wherein said electrically rectifying energy barrier includes said Schottky barrier diode.

24. An electronic system, as recited in claim 23, wherein said Schottky barrier diode provides that only ballistic electrons having energy at least equal to said Schottky barrier height are injected into said collector.

25. An electronic system, as recited in claim 24, wherein said transistor comprises a variable emitter-base voltage and an independently variable collector-base voltage.

26. An electronic system, as recited in claim 25, wherein said transistor emits photons only when said emitter-base voltage exceeds a threshold approximately equal to said Schottky barrier height.

27. An electronic system, as recited in claim 25, wherein said transistor emits photons only when said collector-base voltage exceeds a threshold approximately equal to the difference between bandgap of said collector and said Schottky barrier height.

28. An electronic system, as recited in claim 27, further comprising a first power supply for providing an electrical potential across a collector-base junction of said transistor, wherein when said electrons are injected into said collector over a Schottky barrier with an energy at least equal to energy of said Schottky barrier, the combination of this electron energy and said potential energy provided by said first power supply provides said electrons with enough potential energy to generate photons from recombination in said quantum well.

29. An electronic system, as recited in claim 28, further comprising a second power supply for providing an electrical potential across an emitter-base junction of said transistor, wherein said emitter provides ballistic electrons at an energy exceeding said Schottky barrier when sufficient emitter-base potential is provided.

30. An electronic system, as recited in claim 4, wherein said collector comprises an n type region and a p type region and a region-there-between, wherein said region-there-between has a lower band gap than either said n type region or said p type region so as to trap both electrons and holes for facilitating recombination and photon generation.

31. An electronic system, as recited in claim 30, wherein said region-there-between is undoped or lightly doped.

32. An electronic system, as recited in claim 4, wherein emitter-base contact comprises a second energy barrier.

33. An electronic system, as recited in claim 1, wherein said single device comprises a two-terminal light-emitting transistor, said two terminal transistor comprising a base and a collector, wherein said light is emitted from said collector, wherein said base of said two terminal transistor is exposed for receiving sub-band gap photons to provide internal photo-emission of charges in said base.

34. An electronic system, as recited in claim 1, wherein said single device is included in a magnetic read head, wherein said single device converts magnetic information into an optical signal.

35. An electronic system, as recited in claim 1, further comprising an array of said single devices for storing information and for converting said stored information into optical signals.

36. An electronic system, as recited in claim 1, wherein said single device further comprises amplification.

37. An electronic system, as recited in claim 1, further comprising a power supply, wherein said single device comprises a collector and a base, wherein said power supply is connected for providing a collector-base voltage sufficient to provide secondary electrons by impact ionization to provide amplification.

38. An electronic system, comprising a metal base hot carrier transistor and a source of external magnetic field, said metal base hot carrier transistor having a metal base and a collector, wherein an energy barrier is between said metal base and said collector to block thermalized carriers in said metal base from traveling to said collector, said collector having a p region and an n region for facilitating light emission, said metal base hot carrier transistor further comprising a magnetically sensitive portion including a first magnetically permeable layer and a second magnetically permeable layer, wherein said source of external magnetic field is positioned to intersect said magnetically sensitive portion wherein a change in direction of said external magnetic field switches magnetization state of said second magnetically permeable layer without switching magnetization state of said first magnetically permeable layer.

39. An electronic system, as recited in claim 38, wherein said first magnetically permeable layer and said second magnetically permeable layer comprise a magnetic switch, wherein said change in direction of said external magnetic field facilitates magnetic switching between a first magnetic switch position and a second magnetic switch position.

40. An electronic system, as recited in claim 39, wherein a first intensity of light is emitted in said first magnetic switch position and a second intensity of light is emitted in said second magnetic switch position, wherein said first intensity of light is greater than said second intensity of light.

41. An electronic system, as recited in claim 38, wherein said transistor comprises ballistic spin filtering to spin polarize and analyze said carriers.

42. An electronic system, as recited in claim 38, wherein said metal base comprises a said second magnetically permeable layer.

43. An electronic system, as recited in claim 38, wherein said metal base comprises said first and said second magnetically permeable layers, wherein when said magnetically permeable layers are aligned spin polarized carriers penetrate and when anti-aligned, spin polarized carriers are attenuated.

44. An electronic system, as recited in claim 38, wherein said transistor is included in a magnetic read head, wherein said transistor converts magnetic information into an optical signal.

45. An electronic system, as recited in claim 38, further comprising an array of said transistors for storing information and for converting said stored information into optical signals.

46. An electronic system, as recited in claim 38, wherein said transistor further comprises amplification.

47. An electronic system, as recited in claim 46, wherein said transistor comprises a power supply for providing a collector-base voltage sufficient to provide secondary electrons by impact ionization to provide said amplification.

48. An electronic system, as recited in claim 38, wherein a change in said external magnetic field is capable of switching magnetization orientation of said second magnetically permeable layer.

49. An electronic system, as recited in claim 38, wherein when said first and said second magnetically permeable layers are aligned, hot carriers penetrate and when said first and said second magnetically permeable layers are anti-aligned, said hot carriers are attenuated, wherein said external magnetic field is capable of switching to align and to anti-align said magnetically permeable layers.

50. An electronic system, as recited in claim 38, wherein said said first and said second magnetically permeable layers comprise a spin filter, wherein a change in said external magnetic field can switch magnetization orientation of said second magnetically permeable layer without changing magnetization orientation of said first magnetically permeable layer to facilitate magnetic switching between a first magnetic switch position and a second magnetic switch position.

51. An electronic system, as recited in claim 50, wherein a first intensity of light is emitted in said first magnetic switch position and a second intensity of light is emitted in said second magnetic switch position, wherein said first intensity of light is greater than said second intensity of light.

52. An electronic system, as recited in claim 1, further comprising an optical structure, wherein said optical structure is arranged to collect light emitted by said light emitting portion.

53. An electronic system, as recited in claim 38, wherein said p and n regions include a quantum well, further comprising an optical structure, wherein said optical structure is arranged to collect light emitted by said quantum well.

54. An electronic system, as recited in claim 8, wherein said first and said second magnetically permeable layers are separated by a non-magnetically permeable spacer layer there between.

55. An electronic system, as recited in claim 43, wherein said first and said second magnetically permeable layers are separated by a non-magnetically permeable spacer layer there between.

56. An electronic system, as recited in claim 1, wherein a change in direction of said external magnetic field changes magnetization state of said second magnetically sensitive layer relative to magnetization state of first magnetically sensitive layer, modulates a hot electron current flowing across said energy barrier to said light emitting portion, arid modulates light emission from said light emitting portion.

* * * * *